(12) United States Patent
Bull et al.

(10) Patent No.: US 8,218,790 B2
(45) Date of Patent: Jul. 10, 2012

(54) TECHNIQUES FOR CUSTOMIZING CONTROL OF VOLUME LEVEL IN DEVICE PLAYBACK

(75) Inventors: William Bull, Mountain View, CA (US); Policarpo Wood, San Francisco, CA (US); Kourtny Minh Hicks, Sunnyvale, CA (US); Benjamin Andrew Rottler, Burlingame, CA (US); Eric James Hope, Cupertino, CA (US); Alan Cannistraro, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 988 days.

(21) Appl. No.: 12/198,803

(22) Filed: Aug. 26, 2008

(65) Prior Publication Data

US 2010/0054497 A1    Mar. 4, 2010

(51) Int. Cl.
*H03G 3/00*    (2006.01)
*H03G 3/20*    (2006.01)
*H04R 3/00*    (2006.01)

(52) U.S. Cl. .......... 381/104; 381/102; 381/109; 84/609; 84/612

(58) Field of Classification Search .................. 381/102, 381/104, 106, 109; 84/609, 612
See application file for complete search history.

(56) References Cited

U.S. PATENT DOCUMENTS

| 7,072,477 | B1 | 7/2006 | Kincaid | |
| 7,399,917 | B2 * | 7/2008 | Nakamura et al. | 84/609 |
| 7,674,967 | B2 * | 3/2010 | Makino | 84/612 |
| 2007/0085840 | A1 * | 4/2007 | Asaka et al. | 345/173 |

OTHER PUBLICATIONS iPod classic, from Wikipedia, the free encyclopedia, 7 pages; printed Apr. 7, 2008 from http://en.wikipedia.org/wiki_IPOD-classic; page states it was last modified on Apr. 5, 2008.
iPod classic, Features Guide, 2008, 72 pages.
iPod touch, Features Guide, 2008, 98 pages.
iPod, Features Guide, 2006, 72 pages.
iPod, User's Guide, 2004, 64 pages.
"iTunes' Sound Check and you", Apr. 19, 2005, *Macworld*, from http://www.macworld.com/article/44344/2005/04/soundcheckyou.html.

* cited by examiner

*Primary Examiner* — Phuc Dang
(74) *Attorney, Agent, or Firm* — Kilpatrick Townsend & Stockton LLP (57) ABSTRACT

User interface signals representing volume change requests are converted to volume control signals using a mapping. The mapping is overridden (modified) within a given time interval after starting (which includes resuming) playback. During this interval, the mapping for volume decreases is modified so that the resulting volume decreases are accelerated relative to those that would be generated by the default mapping. This allows the user to quickly reduce the volume of the device when begins playing very loud music. The mapping for volume increases can be modified during this interval.

31 Claims, 7 Drawing Sheets

TECHNIQUES FOR CUSTOMIZING CONTROL OF VOLUME LEVEL IN DEVICE PLAYBACK

BACKGROUND OF THE INVENTION

The present invention relates generally to audio playback devices, and more particularly to controlling the output volume.

Media assets, such as audio tracks, video tracks, or images (e.g., photos) can be stored, displayed, and/or played on a portable media device ("PMD") or on a host computer executing a media management application ("MMA"). Often, a portable media device acquires its media assets from a host computer executing an MMA, and the user may use the MMA to organize the collection of media assets. One example of a PMD may be the iPod® portable media device, currently available from Apple Inc. of Cupertino, Calif. One example of an MMA may be iTunes® media management application, produced by Apple Inc. Some PMDs provide the user a display to aid in interacting with the content on the PMD.

One reason for the popularity of PMDs and MMAs is the ability to store and manage very large collections of audio and video tracks, to arrange them into playlists, and to arrange to have tracks from a variety of sources within the collection played back in any desired order (or randomly if desired). In recognition of the fact that music CDs (and downloadable tracks) are mastered differently, with large discrepancies in volume between songs on different albums, iTunes® and the iPod™ have been provided with what is referred to as the "Sound Check" feature, which allows the user to standardize the volume of all the songs in the collection. This feature can be enabled or disabled at will.

SUMMARY OF THE INVENTION

Embodiments of the present invention operate to change playback volume in response to user input signals that request a volume change by mapping the user input signals to volume change control signals that actually control the volume. The user input requesting a volume change/increase/decrease is often referred to simply as a volume change/increase/decrease request. The user input can be provided by action on a user interface device, for example, by one or more of a gesture on a plurality of capacitive sensors, and/or an actuation of a movable element, and/or a manipulation of a displayed control element, which can be provided by a GUI engine.

Embodiments of the present invention recognize and address the possibility that there are times where the user requires the ability to change the volume more quickly (and/or more slowly) than usual. An example of such a time is an interval (of a duration referred to as $T_{Override}$) following the start of playback. Achieving a faster or slower volume change may entail, during those times, using a mapping between the user input signals and the volume change control signals that is different from the mapping that used at other times. The different mapping is referred to as the override mapping to distinguish it from the default mapping. Since the override mapping is in effect before the default mapping, it is sometimes referred to as the first mapping and the default mapping is sometimes referred to as the second mapping.

In this context, the start of playback is defined broadly to include situations in addition to the first time the user invokes playback of stored assets after power up. Thus, playback should also be considered to have started when the user pauses playback in the middle of a track, for example by pressing a "Pause" button, and then resumes playback by pressing a "Play" button. The two functions are often embodied in a single button that toggles between "Pause" and "Play." Playback can also be considered to have started at the beginning of a track after the end of the previous track. While continuous playback of tracks can have brief periods of silence between the tracks, this is not necessary.

Another situation that is functionally similar to, and should be considered as, the start of playback is a situation during playback when the volume increases substantially after an interval of low-volume playback (i.e., where the volume has fallen below a threshold and remains there for a predetermined period).

While specific embodiments of the present invention deal with portable media devices ("PMDs") and media management applications ("MMAs") where the audio sources are media assets stored on, or otherwise available or retrievable to, the PMD or MMA, the invention is not limited to such environments. Other types of audio playback devices and systems represent additional environments that might benefit from the enhanced volume control provided by embodiments of the present invention.

In an aspect of the invention, a method of controlling playback volume on an audio output device where a volume change request is converted to a volume change control comprises, in response to a volume change request: if the elapsed time since playback started is less than a predetermined interval, using a first mapping to convert the volume change request to a volume change control; otherwise, for at least some elapsed times greater than the predetermined interval, using a second mapping to convert the volume change request to a volume change control, wherein the first mapping is different from the second mapping for at least some volume levels; and using the volume change control to modify the playback volume. In some embodiments, the predetermined interval comprises a plurality of subintervals, and using the first mapping comprises using one or more of a plurality of sub-mappings, at least some of which differ from one another, depending on which of the plurality of subintervals the volume change request falls into.

In embodiments of the present invention, the method can further comprise: at the start of playback, establishing a first volume control state characterized by the first mapping; when the predetermined interval has elapsed, establishing a second volume control state characterized by the second mapping; and when a second predetermined interval has elapsed after the end of the first predetermined interval, at a time after the start of playback, but before the second volume control state is established, establishing a third volume control state characterized by a third mapping of volume change requests to volume change controls, wherein the third mapping is different from the first and second mappings for at least some volume levels.

In another aspect of the invention, a method of controlling playback volume on an audio output device where a volume change request is converted to a volume change control comprises, in response to a volume change request: at the start of playback, establishing a first volume control state characterized by a first mapping of volume change requests to volume change controls; at a time after the start of playback, establishing a second volume control state characterized by a second mapping of volume change requests to volume change controls, where the first mapping is different from the second mapping for at least some volume levels; and in response to a volume change request, changing the volume in accordance with the current volume control state. In some embodiments, the first volume control state comprises a plurality of substates characterized by a plurality of sub-mappings, at least some of which differ from one another, depending on which of the subintervals the volume change request falls into.

In embodiments of the present invention, the method can further comprise: at a time after the start of playback, but before the second volume control state is established, establishing an intermediate volume control state characterized by an intermediate mapping of volume change requests to volume change controls, wherein the intermediate mapping is different from the first and second mappings for at least some volume levels.

In another aspect of the invention, a method of controlling playback volume on an audio output device where a volume change request is defined by respective values of a set of one or more parameters comprises: at the start of playback, establishing a first volume control state characterized by a first set of parameter values that define a response to a volume change request; after a given elapsed time after the start of playback, establishing a second volume control state characterized by a second set of parameter values, wherein the second set of parameter values define a different response to a volume change request than the response defined by the first set of parameter values; and in response to a volume change request, changing the volume in accordance with the current volume control state. In some embodiments: the given elapsed time comprises a plurality of subintervals; the first volume control state comprises a plurality of sub-states, at least some of which differ from one another, depending on which of the plurality of subintervals the volume change request falls into; and the first set of parameter values comprises a plurality of subsets of parameter values.

In embodiments of the present invention, the method can further comprise establishing an intermediate volume control state between the times of establishing the first and second volume control states, wherein the intermediate volume control state is characterized by an intermediate set of parameter values that define a response that is different from the responses of the first and second volume control states.

In another aspect of the invention, an audio output device comprises: a user interface element operable by a user to provide signals representing volume change requests; a level change engine, responsive to volume change requests, for converting a volume change request to a volume change control signal; and a playback engine, responsive to input media signals and to the volume change control signal, for providing audio signals representing the input media signals at a playback volume derived from the volume change control signal.

The level change engine is configured to: use a first mapping to convert a volume change request to a volume change control signal if the volume change request is received within a predetermined interval since playback started; or otherwise, use a second mapping to convert the volume change request to a volume change control signal, wherein the first mapping is different from the second mapping for at least some volume levels. The predetermined interval can comprise a plurality of subintervals, in which case the first mapping can comprise a plurality of sub-mappings, at least some of which differ from one another.

In embodiments of the present invention, the audio output device can further comprise a storage medium and a processor coupled to the storage medium, wherein: the level change engine is implemented by program code stored in the storage medium and executed by the processor; and the first and second mappings are at least in part defined by volume change data stored in the storage medium.

In embodiments of the present invention, the audio output device can further comprise override control that determines whether the level change engine uses the first mapping or the second mapping. The override control can comprise a switch that selects between first and second volume level change generators in the level change engine.

In embodiments of the present invention, the audio output device is a PMD, and further comprises a storage medium and media assets stored in the storage medium In another aspect of the invention, a portable device comprises: a storage medium; a processor coupled to the storage medium; a user interface element operable by a user to provide signals representing volume change requests; computer code stored in the storage medium; and a playback engine. The computer code, when retrieved from the storage medium and executed by the processor: uses a first mapping to convert a volume change request to a volume change control signal if the volume change request is received within a predetermined interval since playback started; or otherwise, uses a second mapping to convert the volume change request to a volume change control signal, wherein the first mapping is different from the second mapping for at least some volume levels.

The playback engine is responsive to input media signals and to the volume change control signal, and provides audio signals representing the input media signals at a playback volume derived from the volume change control signal. The predetermined interval can comprise a plurality of subintervals, in which case the first mapping can comprise a plurality of sub-mappings, at least some of which differ from one another.

In another aspect of the invention, a device comprises: a user interface element operable by a user to provide signals representing volume change requests; a controller coupled to receive the signals representing volume change requests; and a playback engine. The controller is configured to: use a first mapping to convert a volume change request to a volume change control signal if the volume change request is received within a predetermined interval since playback started; or otherwise, use a second mapping to convert the volume change request to a volume change control signal, wherein the first mapping is different from the second mapping for at least some volume levels.

The playback engine is responsive to input media signals and to the volume change control signal, and provides audio signals representing the input media signals at a playback volume derived from the volume change control signal. The predetermined interval can comprise a plurality of subintervals, in which case the first mapping can comprise a plurality of sub-mappings, at least some of which differ from one another.

In other aspects of the invention, a computer-readable medium contains program instructions, which when executed by a computer system in a portable device cause the computer system to execute a method of controlling playback volume on an audio output device where a volume change request is converted to a volume change control. In these aspects of the invention, the method can be one of the methods described above in connection with other aspects of the invention.

In embodiments relating to any of the above methods, apparatus, or computer-readable media, the first and second mappings can differ only over a range of volume levels that is less than the full range of volume levels, or they can differ over the full range of volume levels. The first and second mappings can differ for volume decrease requests for at least some volume levels. The first mapping can provide a faster volume decrease than the second mapping for at least some volume levels. The first and second mappings can differ for volume increase requests for at least some volume levels. The first mapping can provide a slower volume increase than the second mapping for at least some volume levels, or a faster volume increase for at least some volume levels. In some embodiments, the first and second mappings differ for volume decrease requests for at least some volume levels, and also differ for volume increase requests for at least some volume levels.

Further, in embodiments relating to any of the above methods, apparatus, or computer-readable media, the nature of the override can be tailored to take the current volume into account. As one example, the acceleration of volume decreases can be reduced or disabled when the current volume is below a specified threshold. Similarly the deceleration of volume increases can be increased when the current volume is above a specified threshold. Additionally, embodiments of the present invention can disable the override entirely for volumes below a specified threshold. These possible modifications to the override can themselves be implemented as user-settable preferences.

A further understanding of the nature and advantages of the present invention may be realized by reference to the remaining portions of the specification and the drawings.

DESCRIPTION OF SPECIFIC EMBODIMENTS

Figure 1A:
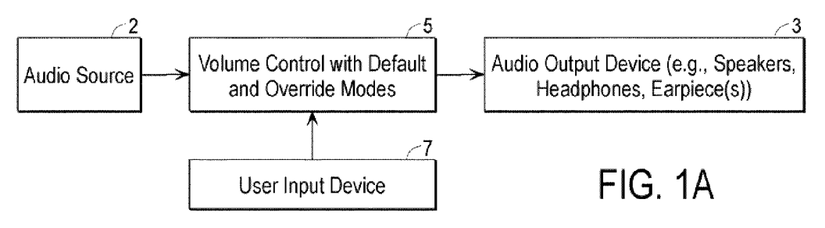
FIG. 1A is a block diagram of a device according to an embodiment of the present invention.

FIG. 1A is a block diagram of a device according to an embodiment of the present invention that provides enhancements to volume control of output audio. An audio source 2 provides audio signals to an audio output device 3. A volume control mechanism 5 is interposed between audio source 2 and audio output device 3, and determines the output volume. Volume control mechanism 5 receives user input from a user input device 7. A broad range of user input devices will be described below.

In accordance with embodiments of the present invention, the volume control mechanism has default and override modes where the manner in which signals from user input device 7 are mapped to volume control signals differs during certain intervals following the start of playback. As mentioned above, the term "start of playback" or the like is defined broadly to include situations in addition to the first time the user invokes playback of stored assets after power up. The start of playback is defined to occur when a user resumes playback after having paused it (for example by toggling a Play/Pause button), when a track begins after the end of the previous track, when the volume increases significantly after an interval of low-volume playback (i.e., where the volume has fallen below a threshold and remains there for a predetermined period). Although a wide variety of override mappings will be described below, a few scenarios and examples will be mentioned at this point.

Typical scenarios addressed by embodiments of the present invention include situations where the volume at the start of playback is higher than the volume the user was expecting or desiring. This can be addressed by accelerating a volume decrease request from the user (i.e., using a more aggressive mapping between the user input and the volume decrease). The acceleration can be continued during the entire decrease request, or can be diminished or stopped once the volume has fallen below a given level. In some embodiments of the present invention, the user can specify override parameters as part of configuring the device.

A volume that is unexpectedly low at the start of playback also presents challenges. A user may want to bring the volume up to a reasonably audible level quickly so as not to miss too much of the initial playback, but there is the danger of overshooting and ending up with an overly high volume. This can be addressed by accelerating the increase for volumes up to a certain threshold and then diminishing or stopping the volume increase once the volume reaches that threshold. In other embodiments, the default profile can specify a decelerated volume increase for a range of volumes without any accelerated volume increase.

The connections between the elements can be wired or wireless. For example, user input device 7 can be mounted on a remote control unit that communicates with volume control mechanism 5 using an infrared or an RF communications protocol. Similarly, the audio signal from audio source 2 can be wirelessly streamed to volume control 5 (e.g., via an RF protocol). Similarly, audio from volume control 5 can be wirelessly streamed to audio output device 3. Audio output device 3 can be any device that allows a user to hear, as audible sounds, audio corresponding to the audio signals generated or provided by audio source 2 and moderated by volume control mechanism 5. This includes speakers, headphones, earpieces, and the like.

FIGS. 1B-1E replicate the elements of FIG. 1A, but show different ways that the elements of FIG. 1A can be configured in separable modules. These figures thus provide examples of how embodiments of the present invention can be deployed in different environments. In different examples, different combinations of elements are referred to as being tightly associated. This can be taken to mean that the elements share a common housing, or are connected with cables or the like in a manner that they are intended to remain connected for extended periods of time. In all these examples, a statement that user input device 7 is tightly associated with volume control mechanism 5 should be taken to include the possibility that user input device 7 is on a remote control that communicates with volume control mechanism 5.

Figure 1B:
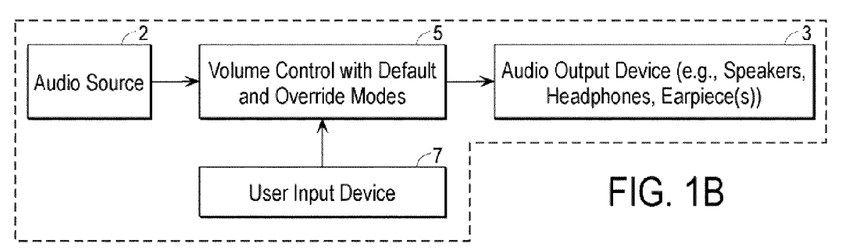
FIGS. 1B-1E are block diagrams showing different ways that the elements of FIG. 1A can be configured in separable modules.
Figure 1C:
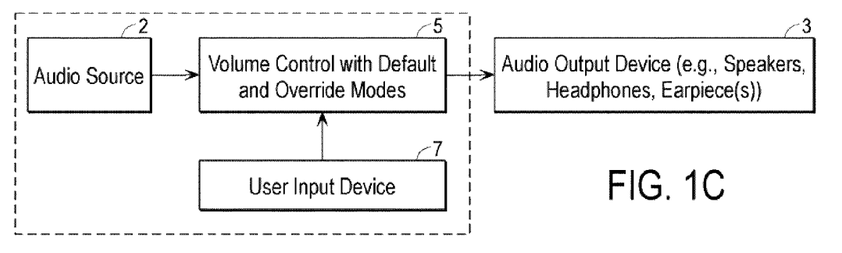

FIG. 1B shows a configuration where all the elements are tightly associated. Examples of this topology include portable and non-portable (e.g., table-top) players and computers that have built-in speakers and have provisions for storing music internally (possibly in removable media). FIG. 1C shows a configuration where audio output device 3 is less tightly associated with the remaining elements, for example where audio source 2, volume control mechanism 5, and user input device 7 are tightly associated, and audio output is provided by external speakers. Examples of this topology include portable and non-portable players that require external speakers or headphones. A particular example is an iPod® portable media device ("PMD") that includes connectors for accessory speakers and headphones.

Figure 1D:
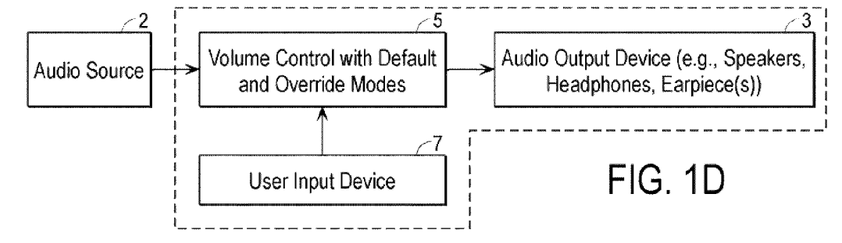

FIG. 1D shows a configuration where audio source 2 is less tightly associated with the remaining elements, for example where audio output device 3, volume control mechanism 5, and user input device 7 are tightly associated, and the source of audio signals is outside. One type of example of this topology is a radio that receives the audio over the airwaves and includes built-in speakers. With a clock radio, playback starts without user intervention, and the user may need or want to turn the volume down extremely quickly. Another type of example is where the audio source is a media player and the remaining elements are part of an accessory that has its own volume control.

Figure 1E:
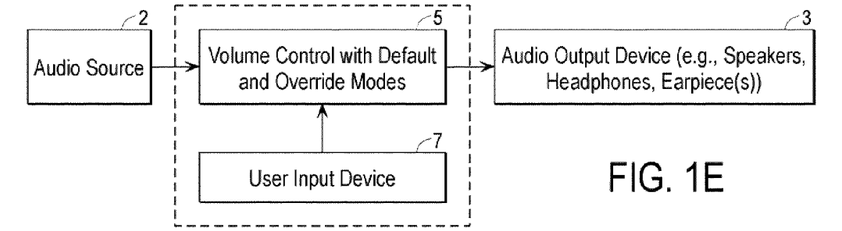

FIG. 1E shows a configuration where audio source 2 and audio output device 3 are less tightly associated with the remaining elements, for example where volume control mechanism 5 and user input device 7 are tightly associated. Examples are discrete audio systems, computers, and other systems where the enhanced volume control is a stand-alone accessory.

The possibilities shown in FIGS. 1B-1E underscore the fact that embodiments of the present invention can be deployed in a wide variety of environments. While much of the following description refers to a portable device such as a portable media device ("PMD"), there is no need to consider the invention to be limited to portable devices, much less PMDs. Rather, embodiments of the present invention can find applicability to any device or system that is capable of outputting audio subject to user control of the output volume.

Figure 2A:
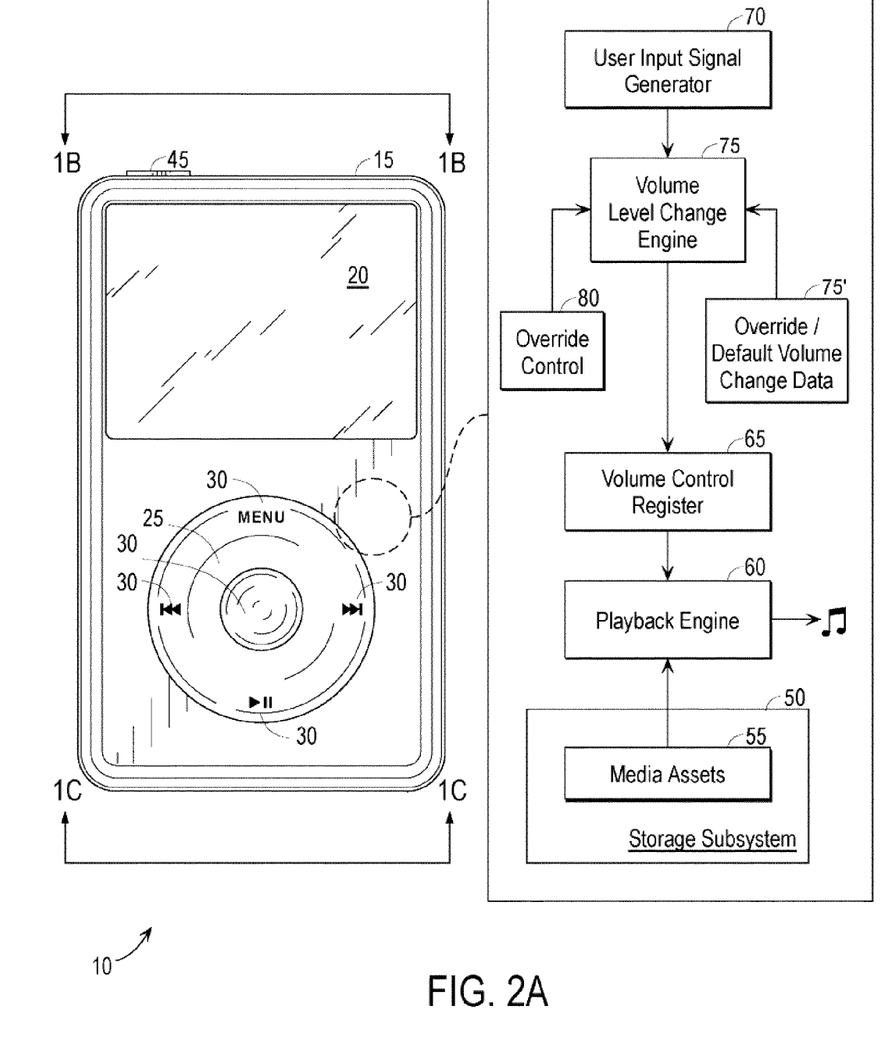
FIG. 2A is a front view of a portable media device ("PMD") or similar device according to an embodiment of the present invention, and further includes a balloon view of volume control and playback components that can be implemented in the PMD.
Figure 2B:
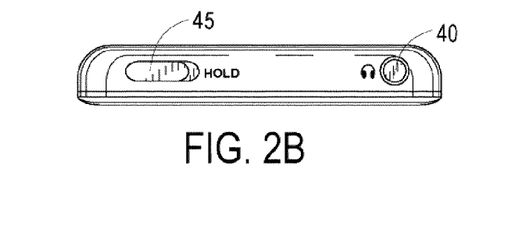
FIG. 2B is a top view of the PMD shown in FIG. 2A.
Figure 2C:
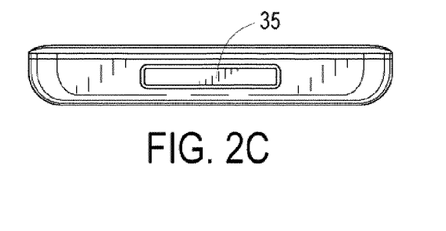
FIG. 2C is a bottom view of the PMD shown in FIG. 2A.

FIGS. 2A, 2B, and 2C are respective front, top, and bottom views of a PMD 10 or similar device according to an embodiment of the present invention. FIG. 2A further includes a balloon view of selected components inside the PMD. For concreteness, the description of PMD 10 will be in terms of a device that, among other things, plays music. PMDs such as Apple's iPod® devices are examples of devices in which embodiments of the present invention can be implemented. Components of PMD 10 may be hidden inside, or visible from outside, a housing 15.

Components disposed outside the housing or disposed to be visible outside the housing can include a display 20, one or more user input devices such as a scroll wheel 25 and buttons 30, one or more I/O connectors such as an accessory interface connector 35 and an audio out connector 40, and one or more switches such as a hold switch 45. The specific PMD includes four buttons denoted by respective text or graphical legends ("Menu", Play/Pause, Forward, Backward), and a fifth button, which is not marked and can be used for selecting items. In the context of an iPod® device, scroll wheel 25 and buttons 30 are collectively referred to as a "click wheel." These components communicate with circuitry and components (not generally shown in FIG. 2A) that are disposed inside housing 15. A number of the components disposed inside housing 15 are shown schematically as an unlabeled phantom circle.

Also shown in FIG. 2A is a balloon view of some of the components inside the housing. Included among these components is a storage subsystem 50 that can be used to store media assets 55 (possibly including metadata not shown separately). Media assets 55 can include any type of media content that can be stored in digital form and experienced by a user. Examples include music, podcasts, audiobooks, video clips, movies, recorded television or radio broadcasts, photographs, slide shows, other still images, and so on. Where the media assets include music, the individual items are sometimes referred to as "tracks" and certain pre-defined collections of tracks are sometimes referred to as "albums." User-defined collections of tracks are sometimes referred to as "playlists."

While a specific PMD is shown in FIGS. 2A, 2B, and 2C, the drawing could also have been drawn as a black box with an input device with which a user interacts to invoke volume changes. The details of PMD 10 beyond this are exemplary of a particular class of devices that can benefit from embodiments of the present invention.

Embodiments of the present invention deal with aspects of volume control for the playback of media assets that are of type that include audio output, and the remaining components shown in FIG. 2A are those whose function is to support the playback and to control the volume of the playback. As discussed above, volume control is achieved by mapping a user input to an output volume. In embodiments of the present invention, the mapping of volume decrease requests is overridden (modified) during a short interval (referred to as $T_{Override}$) after playback starts so that the requested volume decrease is accelerated. Some embodiments of the present invention also operate to override the mapping of volume increase requests.

The primary component responsible for audio playback is a playback engine 60 that operates on media asset data to provide a suitable output for playing the audio. In some embodiments of the present invention, the playback engine can provide USB digital audio on an output interface coupled to a suitable connector such as accessory interface connector 35 as well as analog audio on audio out connector 40 and possibly on accessory interface connector 35. Associated with, or incorporated into, playback engine 60 is a volume control register 65 that receives a volume level signal and effects the appropriate volume control.

The volume level signal that is communicated to volume control register 65 can be controlled by a user manipulating an interface element, with the user's actions converted by a user input signal generator 70 into an electrical signal representing the user's actions. This signal, which represents a volume change request, is then converted or mapped by a volume level change engine 75 having associated volume change data 75' that supports default mapping and override mapping as determined by an override control 80. In some embodiments, the override mapping feature can be enabled and disabled as a matter of user preference.

Volume change data 75' can include, for example, parameter values, lookup tables, and the like to support the default mapping and one or more override mappings, as will be described in greater detail below. Override control 80 determines which mapping is to be applied to the signal from user input signal generator 70, for example by switching from override mapping to default mapping after $T_{Override}$ has elapsed from the start of playback.

Thus, depending on which mapping is in effect, the device can be considered to be in a selected one of first and second volume control states (referred to as default and override states). Each volume control state can be considered to be characterized by a different mapping of volume change requests. Additional embodiments of the present invention can include more than two volume control states. Further, the transition from one state to another need not be abrupt; rather override control 80 can be configured to provide a gradual transition from the override mapping to the default mapping.

In some embodiments of the present invention, override control 80 can cause volume level change engine 75 to prevent signals from passing at the start of playback, and only allow signals to pass in response to a volume change request, with the mapping depending on the elapsed time. In some embodiments of the invention, the volume level change engine can be initialized with the current volume setting and combine the current volume with the user-generated signals to provide absolute volume levels rather than specified volume level changes.

Embodiments of the present invention can be used with any electronic volume control mechanism. In traditional analog audio devices, the user turns a knob, and a potentiometer modifies an electrical signal in a manner that depends on the position of the knob. For example, if the knob is connected to a potentiometer that is connected as a voltage divider, the output signal is a voltage that is a fraction of the input signal. The potentiometer may have a logarithmic profile that represents the human aural response so that equal amounts of rotation would lead to what would be perceived as equal changes in volume.

In more modern incarnations, a user gesture, for example moving a finger along a circular path while engaged with a scroll wheel (e.g., scroll wheel 25), generates an electrical signal that is communicated to circuitry or software that controls the output volume. Other user interface controllers can be used to request a volume change. For example, a user may control volume by manipulating a displayed slider, by pressing volume Up/Down buttons (physical switches or displayed buttons), by gesturing on a touch pad, to name a few known ways. Again, the default mapping provided by volume level change engine 75 could impose a logarithmic mapping as mentioned above.

In all these techniques for requesting a volume change, the user actions requesting such a change are converted into signals, typically electrical signals, that that are then mapped to signals that will control the output volume. Volume control register 65, user input signal generator 70, volume level change engine 75, and override control 80 can be separate hardware components, software components, or a combination. To the extent that some of these are implemented in software, the code that is executed can be stored in storage subsystem 50. For convenience, the signal provided by user input signal generator 70 is referred to as the motion signal, even though some of the user actions (e.g., button presses, voice commands) do not entail movement of an actuator or a finger where the distance of the movement has significance.

Volume control register 65, user input signal generator 70, volume level change engine 75, and override control 80 are drawn as separate elements, the final output of which provides a volume level signal to playback engine 60. This is for convenience only. Depending on the implementation, some of these elements could be more tightly integrated into the playback engine. Further, volume control register 65, volume level change engine 75, and override control 80 represent one way of implementing the functionality of volume control mechanism 5 shown in FIGS. 1A-1E.

Figure 3:
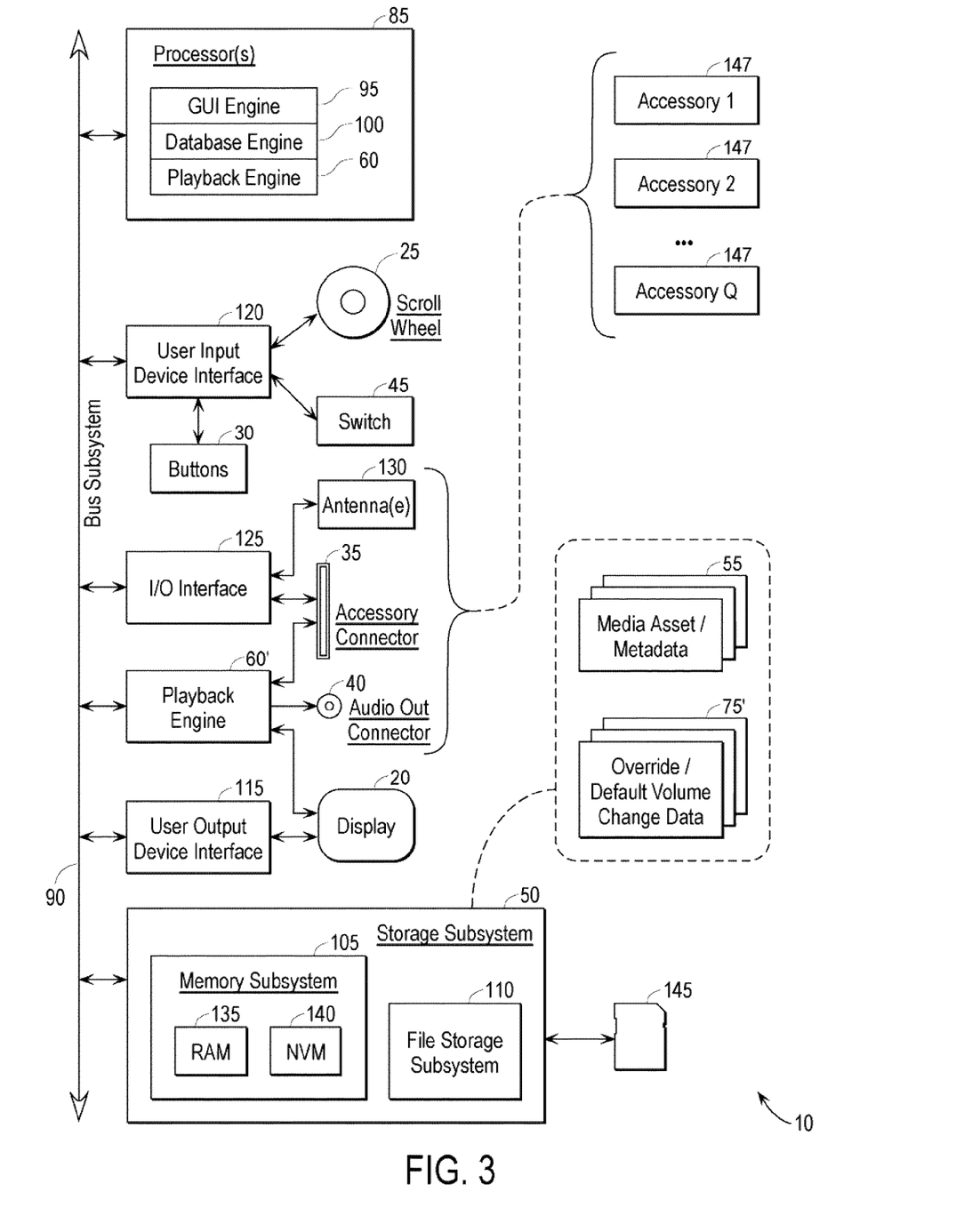
FIG. 3 is a block diagram of a device according to an embodiment of the present invention.

FIG. 3 is a circuit block diagram of a device according to an embodiment of the present invention. For concreteness, the example of PMD 10 will be used, it being understood that PMDs and other devices according to embodiments of the present invention do not need to contain all the components shown, and further that they may contain additional components. Again for concreteness, the description of PMD 10 will be in terms of a device that, among other things, plays music.

PMD 10 is preferably processor-based, and to that end typically includes at least one processor 85, which can be a conventional microprocessor or microcontroller. The processor can communicate with a number of peripheral devices via a bus subsystem 90. The processor is shown as implementing a graphical user interface ("GUI") engine 95, a database engine 100, and playback engine 60. Bus subsystem 90 provides a mechanism for letting the various components and subsystems of PMD 10 communicate with each other as intended. Although bus subsystem 90 is shown schematically as a single bus, embodiments of the bus subsystem may utilize multiple buses, and various of the components may have private connections. Although the specifically described embodiments of the present invention are processor-based embodiments, other embodiments can be implemented with other types of controllers such as combinatorial logic.

In addition to storage subsystem 50, which is shown as having a memory subsystem 105 and a file storage subsystem 110, the devices on the bus can include various interface controllers for interfacing to other devices or functional elements that do not interface to other devices. In the representative configuration shown in FIG. 3, the additional devices include a user output device interface 115 (shown coupled to coupled to display 20), a user input device interface 120 (shown coupled to scroll wheel 25, buttons 30, and switch 45), an I/O interface 125 (shown coupled to accessory interface connector 35 and one or more antenna(e)) 130, and an optional dedicated playback engine 60'.

Embodiments of the present invention can be implemented with many different types of processor. Many PMDs use an embedded processor such as processors using the ARM architecture (a RISC architecture designed by ARM Limited).

GUI engine 95, database engine 100, and playback engine 60 can be implemented, for example, in program code (software or firmware) stored in PMD 10 and running on a processor such one of processors 85, in hardware, or in combinations of the two. Database engine 100, which can be of conventional design, provides various capabilities related to searching, browsing, and selecting assets 55 or groups of assets 55 from storage subsystem 50. Playback engine 60, which can also be of conventional design, provides capabilities related to presenting selected media assets 55 from storage subsystem 50 to a user. In some embodiments of the present invention, playback engine 60 may provide video portions of media assets 55 and/or audio portions of media assets 55 to the user. In some embodiments of the present invention, the playback engine can provide USB digital audio as well as analog audio.

FIG. 3 shows dedicated playback engine 60'; while the playback functionality can be implemented in software by processor(s) 85, as described above, some embodiments of the present invention may have a dedicated playback engine coupled to audio out connector 40. Dedicated playback engine 60' provides decoding of encoded audio files (e.g., MP3, AAC) and digital-to-analog conversion for output at audio out connector 40. For a specific embodiment where the analog audio out signal is provided to accessories through accessory interface connector 35, the playback engine is also coupled to accessory interface connector 35. Conversely, for embodiments of the present invention where there is no dedicated playback engine, I/O interface 125 can be provided with digital-to-analog conversion capability to drive audio out connector 40.

As mentioned above in connection with FIG. 2A, media assets are stored in storage subsystem 50. Also shown in storage subsystem 50 is volume change data 75' that characterizes and possibly supports the override mapping (and possibly the default mapping) of volume level change engine 75. This was also mentioned above. The volume change data can be used by volume level change engine 75 as controlled by override control 80 to provide different desired mappings of volume change requests. For example, different sets of parameters could be read out of storage and loaded into registers before enabling any sound to be output. In other embodiments of the present invention, such parameters can be in firmware more closely bound to dedicated playback engine hardware.

Storage subsystem 50 can include various types of storage media, and stores the basic programming and data constructs that provide at least some of the functionality of PMD 10 For example, the various program modules and databases implementing the functionality of the PMD may be stored in storage subsystem 50. The software modules are generally executed by processor(s) 130. In the case of a PMD, the storage subsystem is used to store media assets 55, which may account for a significant portion of the overall storage capacity.

Memory subsystem 105 typically includes a number of memories including a main random access memory (RAM) 135 for storage of instructions and data during program execution and a non-volatile memory (NVM) 140 in which fixed instructions and fixed system parameters are stored. While the non-volatile memory may be a ROM, rewritable non-volatile memories such as flash EPROMs may be used.

File storage subsystem 160 provides persistent (non-volatile) storage for program and data files, and may include, for example, one or more hard disk drives and/or flash memory drives. Additionally the file storage subsystem may support associated removable media 145, e.g., flash memory cards such as those used in digital cameras and mobile phones. Possible types of flash memory cards include but are not limited to Secure Digital (SD), CompactFlash (CF), Memory Stick (MS), MultiMediaCard (MMC) xD-Picture Card (xD), and SmartMedia (SM).

In some embodiments of the present invention, some of the media assets, or portions thereof, that are stored in file storage subsystem 160 are transferred to a cache in memory subsystem 155, and then read out from the cache by playback engine 60. Transferring significant portions of a media stream to memory before playback can provide a measure of skip protection for hard-drive-based PMDs, and also provides the benefit of allowing the disk drive to be turned off while media are read out from the memory.

I/O interface 125 operates, for wired connections, to provide output signals and receive input signals to and from connectors outside housing 15 such as accessory interface connector 35 and audio out connector 40. It operates, for wireless connections to provide output signals and receive input signals by use of antenna(e) 130. A number of accessories 147, designated Accessory(1) . . . Accessory(Q) are shown coupled to the I/O interface. Accessories 147 can provide additional functionality, and can include such items as earphones, external speakers, microphones, car stereo adapters, wireless adapters, and the like.

I/O interface 125 may include one or more peripheral interfaces such as USB, IEEE 1394 (Firewire), and Bluetooth (a short-range wireless communication standard developed by the Bluetooth SIG and licensed under the trademark Bluetooth®). The I/O interface may also or alternatively include one or more wired networking interfaces (e.g., Ethernet) or wireless networking interfaces (e.g., Wi-Fi adhering to one of the 802.11 family standards, digital mobile phone technologies). Thus, depending on the embodiment, I/O interface 125 can provide an interface to one or more host computers, one or more networks, or accessories coupled to PMD 10. The I/O subsystem need not be configured for all these possibilities; it can be very limited in scope for some embodiments.

For example, the I/O subsystem of some embodiments of the present invention may have the ability to couple PMD 10 to a host computer (via a wired or wireless connection) that provides additional asset management capabilities as can be provided by an MMA. Such asset management capabilities include but are not limited to storing additional assets 55 in storage subsystem 50, removing assets 55 from storage subsystem 50 and/or organizing assets in manners that facilitate desired uses. For example, music assets can be arranged into playlists.

As another example, the I/O subsystem of some embodiments of the present invention (possibly the same as those above, but possibly different embodiments) will have the ability to couple PMD 10 with a source of media assets (e.g., via a wireless connection to the Internet) so that the PMD can obtain media assets without connecting to a host computer. As another example, the I/O subsystem of some embodiments of the present invention (possibly the same as those above, but possibly different embodiments) will have the ability to couple PMD 10 to accessories that expand the capabilities of the PMD (e.g., via accessory interface connector 35 or antenna(e) 130).

As another example, the I/O subsystem of some embodiments of the present invention (possibly the same as those above, but possibly different embodiments) will have the ability to couple PMD 10 to sources of wireless signals that allow the PMD to determine its location. Wireless signals from global positioning satellites can be used for those PMDs that include a GPS receiver. Alternatively, wireless signals from one or more cellular towers can be used by those PMDs that had the ability to triangulate or otherwise decode such signals.

In addition to, or instead of, scroll wheel 25 and buttons 30, the user input devices coupled to user input device interface 120 may include one or more of any or all of the following: keyboards; pointing devices such as mice, trackballs, touchpads, or graphics tablets; scanners, barcode scanners; touchscreens incorporated into displays; audio input devices such as voice recognition systems, microphones, and other types of input devices. In general, use of the term "user input device" is intended to include all possible types of devices and ways for a user to input information into PMD 10. It is noted that some of the above-mentioned user input devices can be coupled to I/O interface 125 through accessory interface connector 35.

In the context of a typical PMD, the input devices can include such devices as a touch screen, a scroll wheel such as scroll wheel 25 in FIG. 2A, buttons such as buttons 30 shown in FIG. 2A, knobs, and the like to receive user input. On a PMD such as some versions of the iPod®, the user may invoke scrolling by touching a scroll wheel and moving a finger in a circular motion. At different times, the scroll wheel has been implemented as an actual rotatable member, or as a series of fixed capacitive sensors disposed under a fixed annular region of the PMD body, which the user "moves" by touching and moving a finger in a circular motion. PMDs and computers with touch interfaces allow various gestures to cause scrolling.

Additional types of input devices could be motion detectors such as accelerometers that can respond to a user's actually moving the device. In the case of a portable device, for example, a clockwise (or counterclockwise) twist of the wrist can be interpreted in a manner analogous to a clockwise (or counterclockwise) actuation of a scroll wheel or a knob. Similarly, while the exemplary input devices were generally described as being mounted to or associated with the PMD or computer, reference to exemplary input devices should be considered to include such devices mounted to or associated with a remote control device. Remote control devices can include wired (tethered) devices (e.g., connected to user input device interface 120 or I/O interface 125, possibly using the accessory connector) and wireless devices communicating via one of antenna(e) 130.

In FIG. 3, the only user output device coupled to user output device interface 115 is a display. The present invention does not rely on any particular type of display, although suitable candidates can include liquid crystal displays (LCDs) or light emitting diode (LED) displays. Some PMDs can also provide non-visual display such as audio output. In general, use of the term "user output device" is intended to include all possible types of devices and ways to output information from PMD 10 to a user. In typical PMDs, the primary display is a visual display, which is used to display visual characteristics of the media assets (e.g., in the case of videos, images, and the like) and metadata (perhaps displayed in lists or in hierarchical menus).

GUI engine 95 can interact with display 20 and user input devices such as scroll wheel 25 and buttons 30 to provide a graphical user interface, allowing a user to control operation of PMD 10. GUI engine 95 can control display 20 to present user interface elements such as text menus, icons or the like, and user input devices can be operated by a user to interact with the displayed user interface elements (e.g., selecting or activating an element, thereby giving an instruction to PMD 10).

In some embodiments of the present invention, user input devices can include a touch-sensitive element overlaying display 20, providing a touch screen interface. In other embodiments of the present invention, user input devices can include distinct devices such as one or more of a scroll wheel 25, buttons 30, a touch pad. In any event, GUI engine 95 can reflect the operation of user input device(s) by updating display 20, e.g., to change which item on a menu is highlighted for selection. The GUI can enable the user to control any aspect of PMD 10, including locating and selecting media assets 55 to be played, controlling playback (e.g., play, pause, fast forward, rewind, etc.), adjusting playback settings (volume, equalizer, etc.), and so on.

A significant aspect of the user output are the sound characteristics of the assets, such as the music or words of audio tracks and the soundtrack of videos. As such, some of the embodiments of the present invention are concerned with facilitating the playback of music.

Figure 4A:
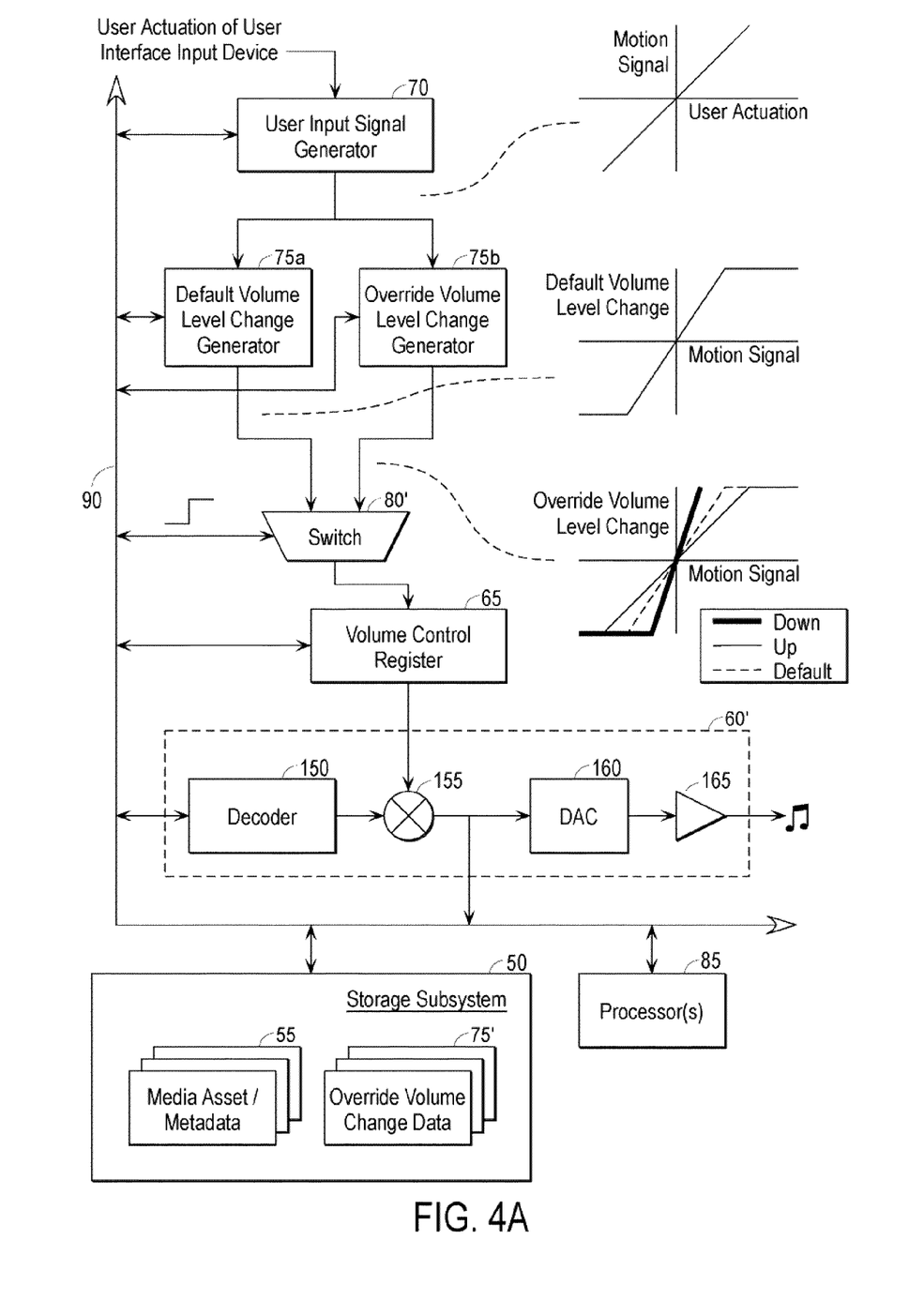
FIG. 4A is a block diagram showing additional details of the playback engine and connected components relating to volume control in an embodiment of the present invention.

FIG. 4A is a block diagram showing additional details of playback engine 60 or dedicated playback engine 60' and connected components relating to volume control in an embodiment of the present invention. The playback engine comprises a decoder 150, a multiplier 155, a digital-to-analog converter ("D/A converter" or "DAC") 160, and a preamplifier 165. The decoder and multiplier can be implemented in hardware or software, while the DAC and preamplifier are by nature hardware elements. In embodiments of the present invention where the decoder and multiplier are implemented on a dedicated decoder chip, volume control register 65 can be one of the chip's on-chip registers.

Decoder 150 receives media asset data from storage subsystem 50, decodes it, and passes the decoded values to multiplier 155, which multiplies them by a value specified by volume control register 65. The digital values, at the specified volume, are communicated to bus subsystem 90 and also to DAC 160. The analog output of the DAC is amplified by preamplifier 165 to provide a line level output, which can be communicated to audio out connector 40 and/or accessory interface connector 35 (not shown). The digital output from multiplier 155, shown as communicated to the bus subsystem, can be provided to accessory interface connector 35 (not shown) or any other digital output.

In this embodiment of the present invention, volume level change engine 75 is represented by a default volume level change generator 75a and an override volume level change generator 75b. Thus, the signal that is received by volume control register 65 is a selected one of a first (default) signal provided by default volume level change generator 75a and a second (override) signal provided by override volume level change generator 75b, as determined by override control 80, which is represented by a switch 80'. The switch can be actuated at a time $T_{Override}$ following the start of playback to switch from override volume level change generator 75b to default volume level change generator 75a.

Thus, depending on which signal is being selected, the device can be considered to be in a selected one of first and second volume control states (referred to as default and override states). Each volume control state can be considered to be characterized by a different mapping of user volume change requests. Additional embodiments of the present invention can include more than two volume control states. Further, the transition from one state to another need not be abrupt; rather it is possible to configure switch 80 so that it initially provides the override signal and during a transition interval mixes the two signals so that at the end of the interval the output is the default signal.

The notion of a switch selecting one of two volume level change generators is a schematic view. In one set of embodiments of the present invention, the switch can select override volume level change generator 75b at the start of playback, and then select default volume level change generator 75a after the predetermined time interval $T_{Override}$. In other embodiments of the present invention, the switch can remain blocking at the start of playback, and only allow signals to pass in response to a volume change request, with the selected volume level change generator depending on the elapsed time. Indeed, the notion of multiple volume level change generators, at the broadest, should be taken to cover the case where different parameter values are loaded into the same set of registers.

The figure shows user input signal generator 70, default volume level change generator 75a (or override volume level change generator 75b), switch 80, and volume control register 65 connected in series, as well as being coupled to bus subsystem 90. Embodiments of the present invention can utilize any combinations of these connections so long as the functionality of the signals passing from one block to the other remains. At one extreme, there are embodiments where there are no series connections, and all communications are over the bus subsystem. At the other extreme, there are embodiments where there are no bus connections and all communications are over the series paths from one block to the next. This is consistent with the statement in the Device Hardware Overview that the bus schematic is a simplification and there may be multiple buses and there might be private connections among devices. The operation of the volume control elements will now be described.

Figure 4B:
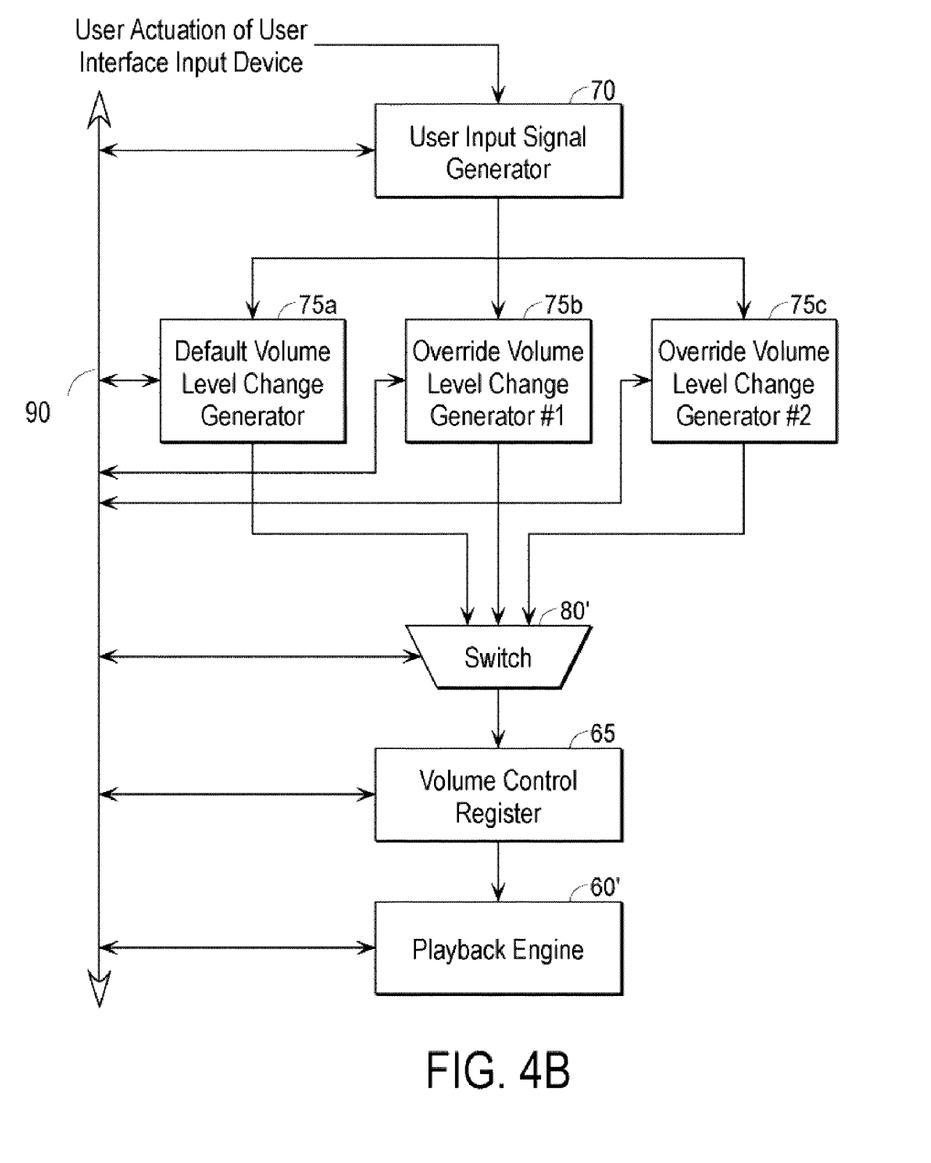
FIG. 4B is a block diagram showing the playback engine and connected components relating to volume control in an alternative embodiment of the present invention.

FIG. 4B is a block diagram showing the playback engine and connected components relating to volume control in an alternative embodiment of the present invention. This embodiment differs from that shown in FIG. 4A in that there is an additional override volume level change generator 75c in parallel with default volume level change generator 75a and override volume level change generator 75b, and switch 80 has three inputs rather than two. This embodiment is an example of embodiments with more than two volume control states; in this specific example, the transition from an override state to the default state occurs in two steps. It is also possible to configure a single override volume level change generator to change its acceleration parameter(s) during the override volume control state.

Thus, in this embodiment of the present invention, the first and second states can be considered override states characterized by first and second predetermined intervals $T_{Override}$ and $T_{Override}'$ during which first and second override mappings are used. When the second predetermined interval has elapsed after the end of the first predetermined interval, the third (default) volume control state is established, characterized by a third mapping of volume change requests to volume change controls.

Conceptually the first two override states with their respective time intervals and mappings can be viewed as a single override interval with the override mapping having a time dependence. Put another way, the first and second states can be viewed as constituting a single override state characterized by a single time interval and a single mapping. However, the override state comprises two or more sub-states with respective sub-intervals and sub-mappings.

User input signal generator 70 generates a signal, referred to as the motion signal, that represents the user's interaction with a user interface element to request a volume change. For embodiments of the present invention where the user moves a slider or wheel or moves a finger relative to a fixed structure, the motion signal encodes one or more characteristics of the user's motion (for example one or more of position, velocity, and acceleration). This is shown schematically as a graph (Motion Signal vs. User Actuation) to the right of user input signal generator 70. Depending on the implementation, the motion signal can be a defined function of the user input. For simplicity, this is shown as a linear function in the figure, but other functional relationships are possible.

In embodiments of the present invention where the user interface element is a scroll wheel that uses a plurality of capacitive sensors to detect finger position, the sensors provide electrical signals upon detecting the capacitance of the user's finger. In some implementations, the user input signal generator can then transform these signals to a time dependent position signal. Depending on the PMD context, however, this signal can represent user input specific to that context. For example, in at least some iPod® models, the scroll wheel can be used to scroll menu items as well as to control playback volume. Thus user input signal generator 70, while shown as part of the overall volume control functionality, can be a general purpose module (hardware, software, or a combination).

For purposes of example, consider that the output from user input signal generator 70 provides the position, and is updated sufficiently frequently that subsequent processing blocks can integrate and/or differentiate the signal to the extent that the total distance or the velocity is needed. For embodiments of the present invention where the user input device is a mechanical slider or wheel, the output signal can provide the distance from the initial position or can provide the absolute position.

In other embodiments of the present invention, the user presses one or more buttons to request a volume change. As noted above, the term motion signal is used in connections with these embodiments where the user is not generating a displacement whose extent matters. In button-based embodiments, the output (motion) signal can be based on the number of button presses (clicks). Some implementations can provide a pair of buttons (Up/Down or ±). The output can vary linearly or non-linearly with respect to the number of presses. Further, an extended button press can be used to invoke a signal that increases or decreases in proportion to, or as a non-linear function of, the duration of the press. The output signal can also provide information on the intervals between repeated button presses.

As mentioned above, volume level change engine 75 converts user input signal generator 70's motion signal, which provides a measure of the user's action to control the volume, to a signal relating to a desired volume level. This is shown schematically as a graph (Default Volume Level vs. Motion Signal) to the right of default and override volume level change generators 75 and 75b. The discussion in this section is not limited to the embodiments of FIGS. 4A and 4B, but generally applies to other embodiments of the volume level change engine.

Assume for the sake of example that the output signal from user input signal generator 70 is a time dependent position signal. For further sake of example, assume that the user input device is touch sensitive. There are a still a number of ways in which the signal can be used to control volume. In some embodiments of the present invention, the location of the initial finger contact can be interpreted as requesting the intended volume, with subsequent finger motion (while maintaining contact) is ignored. Thus, a mere touch can be used to set the volume. In other embodiments, the initial finger contact is ignored until some motion is detected. At that point, the volume can be increased or decreased as a function of the direction and amount of movement. Similar considerations can apply in the case of indirect pointing devices with distinctions between the ways clicks and drags are interpreted.

The figure shows the dependence of Default Volume Level as increasing for motion to the right and decreasing for motion to the left, with upper and lower cutoffs for the maximum and minimum volume levels. What this means is that should the user continue moving the actuator or finger past the point where the volume level reaches one of the extreme values, further movement will have no further effect on the volume level. The graph is stylized in the sense that the mapping depends on the volume level when the movement begins. For example, if the volume level is at the minimum, when the user starts movement to increase the volume, the volume trajectory will begin at the bottom left kink in the graph, and continue up the graph toward the right. Similarly, if the volume level is at the maximum, when the user starts movement to decrease the volume, the volume trajectory will begin at the upper right kink in the graph, and continue down the graph toward the left.

While the figure shows volume level as a linear function of the motion signal (i.e., characterized by a single slope parameter), other functional relationships are possible. For example, some implementations can provide a measure of acceleration/deceleration depending on the speed of the user's motion (i.e., on the rate of change of the motion signal). For example, in some such implementations, short fast movements can be interpreted to result in as much volume level change as slower longer movements. The characteristics of such acceleration can be specified by an analytic function such as a polynomial or an exponential, or can be specified in a lookup table (whether or not the function has an analytic form). The possibility of providing acceleration or any other non-linear treatment to the mapping is a separate issue from the volume level override feature, which is described in greater detail below.

The opportunities for acceleration/deceleration apply to button-press embodiments of the present invention. Where the motion signal is incremented by repeated button presses, the counterpart to speed of translational or rotational movement is the speed at which the button is repeatedly pressed. Thus a small number of rapid presses can be interpreted to result in as much volume level change as a larger number of presses that occur at less frequent intervals. Acceleration can also be applied to extended button presses.

As mentioned above, volume level change engine 75 also provides an override mapping between the motion signal and the volume level that differs from the default mapping. This is shown schematically as a graph (Override Volume Level vs. Motion Signal) to the right of switch 80 and volume control register 65. For ease of explanation, the mapping for the default volume level change generator is shown in phantom. In representative embodiments of the present invention, the override mapping is selected by override control 80 when playback starts. As mentioned above, the start of playback should be understood to include, for example, the user's starting playback after power up, the user's resuming playback after having paused playback, the start of a new track, or a volume increase after an interval of very soft playback. The discussion in this section is not limited to the embodiments of FIGS. 4A and 4B, but generally applies to other embodiments of the volume level change engine.

When the user requests a decrease in volume, the override mapping provided by volume level change engine 75 accelerates the decrease. For the example of a linear function, the slope parameter has a larger absolute value than the corresponding slope parameter for the default mapping provided by volume level change engine 75. The mapping for movements requesting a decrease in volume is shown as a heavy line. As noted above, this is separate from, and in addition to, any acceleration or deceleration provided for the default mapping. Possible reasons that the user might want a very rapid response to efforts to turn down the volume is that the volume may be significantly higher than the user was expecting. This could be uncomfortable for a user wearing earphones, and could be annoying or embarrassing where the device is playing through speakers.

In some embodiments of the present invention, the override profile is deselected after a predetermined time interval $T_{Override}$ (say 10-15 seconds), because by then the user is likely to have adjusted the volume or decided that the volume at the start of playback was acceptable.

In some embodiments of the present invention, volume level change engine 75, when operating with the override mapping, also modifies the default mapping for user efforts to increase the volume. The mapping for movements requesting an increase in volume is shown as a normal-weight solid line. As shown in the figure, when the user requests an increase in volume, volume level change engine 75 decelerates the increase. There are other possibilities, as will be discussed below.

Figure 5A:
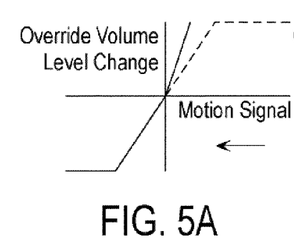
FIGS. 5A, 5B, and 5C are graphs showing alternative override mappings for volume decrease requests.
Figure 5B:
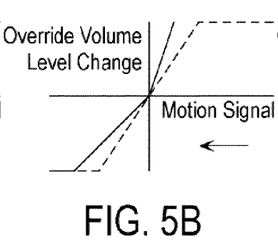
Figure 5C:
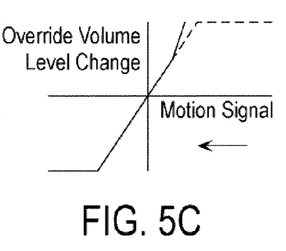

FIGS. 5A, 5B, and 5C are graphs showing alternative override mappings for requested decreases in volume. In the embodiment of the present invention shown in FIG. 4A, the mapping is a uniform acceleration of the decrease (e.g., slope magnitude doubled) for all initial and subsequent volume levels. FIG. 5A shows an embodiment where the mapping provides an acceleration of the decrease for initial and subsequent volume levels above a middle volume level, and then a default decrease for volume levels below the middle volume level. FIG. 5B shows an embodiment where the mapping provides an acceleration of the decrease for initial and subsequent volume levels above the middle volume level, and then a decelerated decrease for volume levels below the middle volume level. FIG. 5C shows an embodiment where the mapping provides an acceleration of the decrease for initial and subsequent volume levels above a medium-loud volume level, and then a default decrease for volume levels below the medium-loud volume level.

Figure 6A:
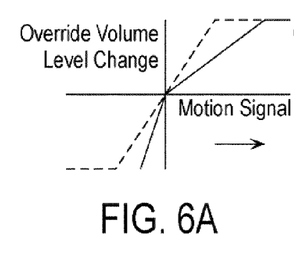
FIGS. 6A, 6B, and 6C are graphs showing alternative override mappings for volume increase requests.
Figure 6B:
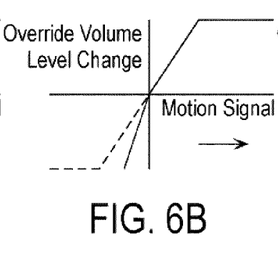
Figure 6C:
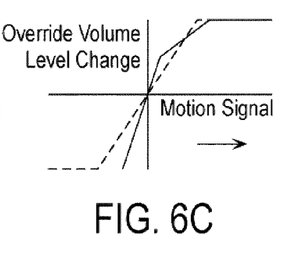

FIGS. 6A, 6B, and 6C are graphs showing additional override mappings for requested increases in volume. In the embodiment of the present invention shown in FIG. 4A, the mapping provides a uniform deceleration of the increase (e.g., slope at ⅔ the slope of default increase) for all initial and subsequent volume levels. FIG. 6A shows an embodiment where the mapping provides an acceleration of the increase for initial and subsequent volume levels below a middle volume level, and then a decelerated increase for volume levels above the middle volume level. FIG. 6B shows an embodiment where the mapping provides an acceleration of the decrease for initial and subsequent volume levels below the middle volume level, and then a default increase for volume levels above the middle volume level. FIG. 6C shows an embodiment where the mapping provides an acceleration of the decrease for initial and subsequent volume levels below a medium-loud volume level, and then a decelerated increase for volume levels above the medium-loud volume level.

The choice of acceleration/deceleration profiles may depend on a number of considerations. For example, a more aggressive accelerated decrease in volume level can be used when the PMD is playing back through headphones, since user discomfort can be a greater consideration with headphones than with speakers. Since some PMD models can sense when they are connected to speakers, this can be done automatically. Although not illustrated, embodiments of the present invention can also provide near-instantaneous volume decrease or increase to a predetermined level. For example, the mapping shown in FIG. 5C can be modified so that an initial segment of the graph is vertical (i.e., any volume decrease request during the override interval results in a substantially immediate drop to a lower volume.

It is noted that in the embodiments of FIGS. 5A, 5B, 5C, 6A, 6B, and 6C, the acceleration and deceleration profiles depend on the current absolute volume level. In such cases, volume level change engine 75, possibly implemented as including override volume level change generator 75b, can be provided with absolute volume information before playback starts. In those embodiments of the present invention where volume level change engine 75 provides an absolute volume level rather than volume level increments, this would already be taken into account. Different embodiments of the present invention can use different combinations of the override mappings shown for volume increase requests and volume decrease requests. Thus, for example, a particular embodiment can use any one of the mappings shown in FIGS. 5A, 5B, and 5C, combined with any of the mappings shown in 6A, 6B, and 6C.

Figure 7:
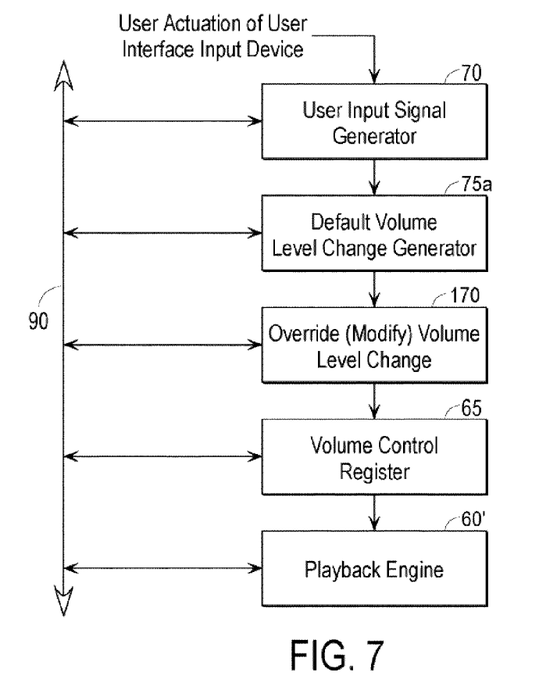
FIG. 7 is a block diagram showing portions of the playback engine and connected components in an alternative embodiment of the present invention.

FIG. 7 is a block diagram showing portions of the playback engine and connected components in an alternative embodiment of the present invention. In this embodiment, the override functionality is provided by an override volume level change block 170 in series with a default volume level change generator 75a. As in the embodiment of FIG. 4A, the elements are also shown as being connected to bus subsystem 90, and this embodiment can utilize any combinations of these connections so long as the functionality of the signals passing from one block to the other remains.

Along the lines of the embodiment of FIG. 4A, override volume level change block 170 is disabled at some time after playback has started. This can be achieved in a number of ways, for example by a bypass switch within the block (not shown) or a branch in software. To the extent that the override volume level change block's acceleration/deceleration profiles depend on the current absolute volume level, the absolute volume level can be provided.

Figure 8A:
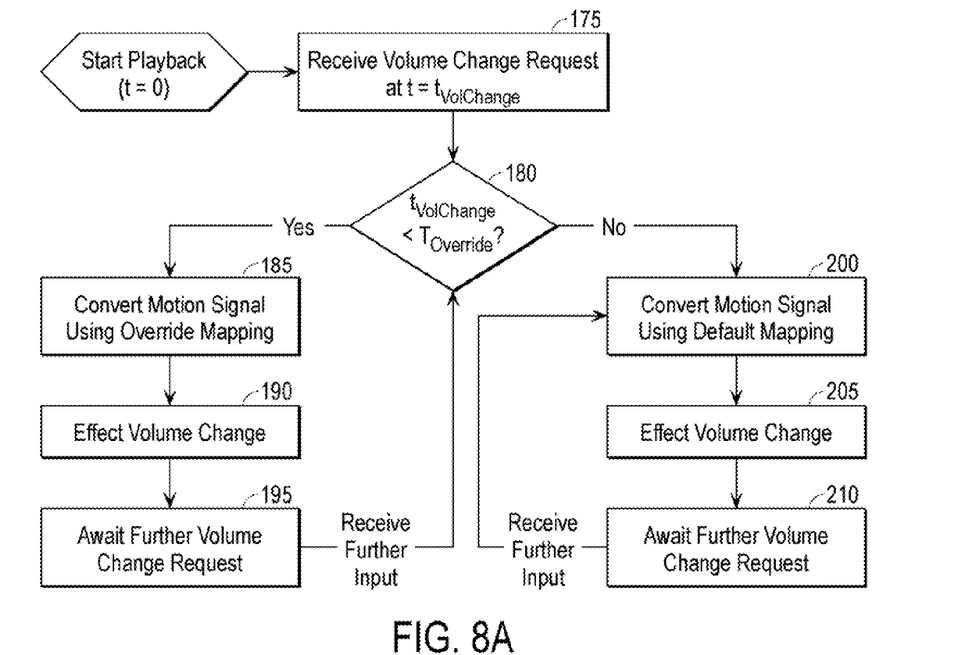
FIGS. 8A and 8B are flowcharts showing alternative ways of determining whether to use the override mapping or the default mapping.
Figure 8B:
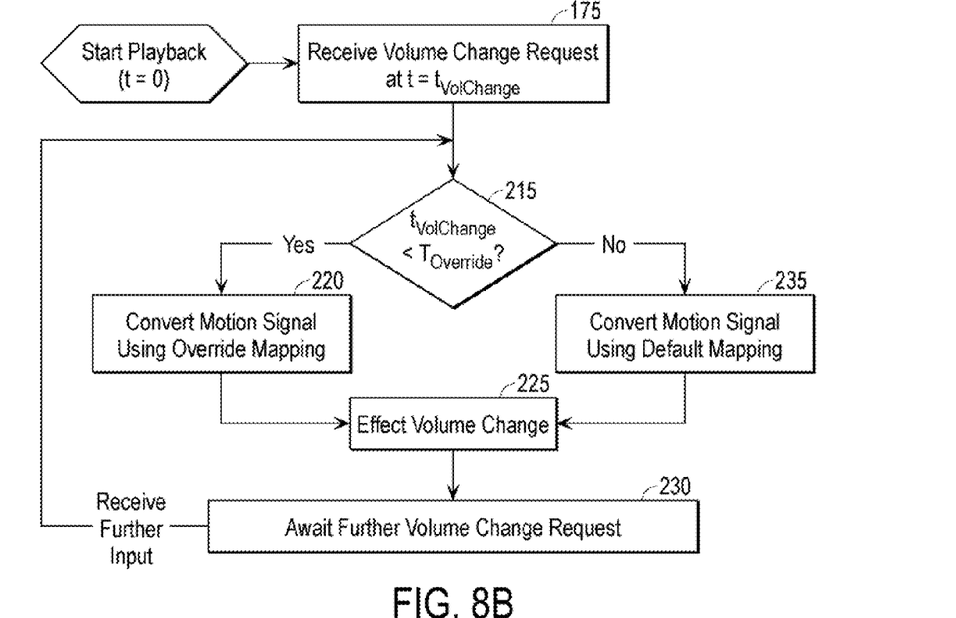

FIGS. 8A and 8B are flowcharts showing alternative ways of determining whether to use the override mapping or the default mapping. Both flowcharts represent the start of playback (denoted as t=0) followed by a first instance of receiving a volume change request at a step 175. The time of receiving a volume change request, either at step 175 or at a later time is denoted as $t_{VolChange}$. That is, $t_{VolChange}$ represents the elapsed time from the start playback to the time at which the user requests a volume change.

In the embodiment of FIG. 8A, $t_{VolChange}$ is compared to $T_{Override}$ at a step 180 to determine whether the time of the volume change request is still within the time interval where the override mapping is to be used rather than the default mapping. If it is, the motion signal is transformed using the override mapping at a step 185, the volume is changed at a step 190, and the device awaits further volume change requests at a step 195. When a further volume change request is received, control is passed back to step 180 where $t_{VolChange}$ is again compared to $T_{Override}$.

If at step 180 (whether entered from step 175 or step 195), it is determined that the time of the volume change request ($t_{VolChange}$) is no longer within the time interval $T_{Override}$, the motion signal is transformed using the default mapping at a step 200, the volume is changed at a step 205, and the device awaits further volume change requests at a step 210. When a further volume change request is received, control is passed back to step 200, and no more tests of $t_{VolChange}$ are made.

In the embodiment of FIG. 8B, $t_{VolChange}$ is compared to $T_{Override}$ at a step 215. If $t_{VolChange}$ is less than $T_{Override}$, the motion signal is transformed using the override mapping at a step 220, the volume is changed at a step 225, and the device awaits further volume change requests at a step 230. If it is determined at step 215 that $t_{VolChange}$ is not less than $T_{Override}$, the motion signal is transformed using the default mapping at a step 235, the volume is changed at a step 225, and the device awaits further volume change requests at a step 230. In either case, when a further volume request change is received, control is passed back to step 215, and the elapsed time is tested for every subsequent volume change request.

In conclusion can be seen that embodiments of the present invention provide additional functionality that can enhance user experience and convenience when using devices such as PMDs. For example, the special volume control mapping at the start of playback allows the user to ameliorate quickly the effect of an excessive volume level.

While the above is a complete description of specific embodiments of the invention, the above description should not be taken as limiting the scope of the invention as defined by the claims.

What is claimed is:

1. A method of controlling playback volume on an audio output device wherein user input requesting a volume change, referred to as a volume change request, is converted to a volume change control, the method comprising, in response to a volume change request:

if the elapsed time since playback started is less than a predetermined interval, using a first mapping to convert the volume change request to a volume change control;

otherwise, for at least some elapsed times greater than the predetermined interval, using a second mapping to convert the volume change request to a volume change control, wherein the first mapping is different from the second mapping for at least some volume levels; and using the volume change control to modify the playback volume.

2. The method of claim 1 wherein:

the predetermined interval comprises a plurality of sub-intervals; and using the first mapping comprises using one or more of a plurality of sub-mappings, at least some of which differ from one another, depending on which of the plurality of subintervals the volume change request falls into.

3. The method of claim 1 wherein:

the first and second mappings differ for volume decrease requests for at least some volume levels; and the first and second mappings differ for volume increase requests for at least some volume levels.

4. The method of claim 1 wherein:

the first mapping provides a faster volume decrease than the second mapping for at least some volume levels; and the first mapping provides a slower volume increase than the second mapping for at least some volume levels.

5. The method of claim 1 wherein the user input is provided by one or more of:

a gesture on a plurality of capacitive sensors;

an actuation of a movable element;

a manipulation of a displayed control element.

6. The method of claim 1, and further comprising:

at the start of playback, establishing a first volume control state characterized by the first mapping.

7. The method of claim 1, and further comprising:

when the predetermined interval has elapsed, establishing a second volume control state characterized by the second mapping.

8. The method of claim 1, and further comprising:

at the start of playback, establishing a first volume control state characterized by the first mapping;

when the predetermined interval has elapsed, establishing a second volume control state characterized by the second mapping; and when a second predetermined interval has elapsed after the end of the first predetermined interval, at a time after the start of playback, but before the second volume control state is established, establishing a third volume control state characterized by a third mapping of volume change requests to volume change controls, wherein the third mapping is different from the first and second mappings for at least some volume levels.

9. A method of controlling playback volume on an audio output device wherein volume changes are effected in response to user input requesting a volume change, referred to as a volume change request, the method comprising:

at the start of playback, establishing a first volume control state characterized by a first mapping of volume change requests to volume change controls;

at a time after the start of playback, establishing a second volume control state characterized by a second mapping of volume change requests to volume change controls, wherein the first mapping is different from the second mapping for at least some volume levels; and in response to a volume change request, changing the volume in accordance with the current volume control state.

10. The method of claim 9 wherein:

the first volume control state comprises a plurality of sub-states characterized by a plurality of sub-mappings, at least some of which differ from one another, depending on which of the subintervals the volume change request falls into.

11. The method of claim 9 wherein the first and second mappings differ only over a range of volume levels that is less than the full range of volume levels.

12. The method of claim 9 wherein the first and second mappings differ over the full range of volume levels.

13. A method of controlling playback volume on an audio output device wherein the response to user input requesting a volume change, referred to as a volume change request, is defined by respective values of a set of one or more parameters, the method comprising:
 at the start of playback, establishing a first volume control state characterized by a first set of parameter values that define a response to a volume change request;
 after a given elapsed time after the start of playback, establishing a second volume control state characterized by a second set of parameter values, wherein the second set of parameter values define a different response to a volume change request than the response defined by the first set of parameter values; and
 in response to a volume change request, changing the volume in accordance with the current volume control state.

14. The method of claim 13 wherein:
 the given elapsed time comprises a plurality of subintervals;
 the first volume control state comprises a plurality of substates, at least some of which differ from one another, depending on which of the plurality of subintervals the volume change request falls into; and
 the first set of parameter values comprises a plurality of subsets of parameter values.

15. The method of claim 13, and further comprising establishing an intermediate volume control state between the times of establishing the first and second volume control states, wherein the intermediate volume control state is characterized by an intermediate set of parameter values that define a response that is different from the responses of the first and second volume control states.

16. An audio output device comprising:
 a user interface element operable by a user to provide signals representing volume change requests;
 a level change engine, responsive to volume change requests, for converting a volume change request to a volume change control signal, said level change engine configured to:
  use a first mapping to convert a volume change request to a volume change control signal if the volume change request is received within a predetermined interval since playback started; or
  otherwise, use a second mapping to convert the volume change request to a volume change control signal, wherein said first mapping is different from said second mapping for at least some volume levels; and
 a playback engine, responsive to input media signals and to said volume change control signal, for providing audio signals representing the input media signals at a playback volume derived from said volume change control signal.

17. The device of claim 16 wherein:
 said predetermined interval comprises a plurality of subintervals; and
 said first mapping comprises a plurality of sub-mappings, at least some of which differ from one another.

18. The device of claim 16, and further comprising a storage medium and a processor coupled to said storage medium, wherein:
 said level change engine is implemented by program code stored in said storage medium and executed by said processor; and
 said first and second mappings are at least in part defined by volume change data stored in said storage medium.

19. The device of claim 16, and further comprising an override control that determines whether said level change engine uses said first mapping or said second mapping.

20. The device of claim 19 wherein:
 said level change engine comprises first and second volume level change generators configured to use said first and second mappings, respectively; and
 said override control comprises a switch that selects between said first and second volume level change generators.

21. The device of claim 16 wherein said first mapping provides a faster volume increase than said second mapping for at least some volume levels.

22. The device of claim 16 wherein:
 said first and second mappings differ for volume decrease requests for at least some volume levels; and
 said first and second mappings differ for volume increase requests for at least some volume levels.

23. The device of claim 16 wherein the user interface element comprises one or more of:
 a plurality of capacitive sensors;
 a movable element; or
 a displayed control element provided by a GUI engine.

24. The device of claim 16 wherein the device is a portable media device, and further comprises a storage medium and media assets stored in said storage medium.

25. A portable device comprising:
 a storage medium;
 a processor coupled to said storage medium;
 a user interface element operable by a user to provide signals representing volume change requests;
 computer code stored in said storage medium wherein said computer code, when retrieved from said storage medium and executed by said processor:
  uses a first mapping to convert a volume change request to a volume change control signal if the volume change request is received within a predetermined interval since playback started; or
  otherwise, uses a second mapping to convert the volume change request to a volume change control signal, wherein said first mapping is different from said second mapping for at least some volume levels; and
 a playback engine, responsive to input media signals and to said volume change control signal, for providing audio signals representing the input media signals at a playback volume derived from said volume change control signal.

26. The device of claim 25 wherein said first mapping provides a faster volume decrease than said second mapping for at least some volume levels.

27. The device of claim 25 wherein said first and second mappings differ for volume increase requests for at least some volume levels.

28. The device of claim 27 wherein said first mapping provides a slower volume increase than said second mapping for at least some volume levels.

29. A computer-readable medium containing program instructions, which when executed by a computer system in a portable device cause the computer system to execute a method of controlling playback volume on an audio output device wherein the response to user input requesting a volume change, referred to as a volume change request, is defined by respective values of a set of one or more parameters, the method comprising:
- at the start of playback, establishing a first volume control state characterized by a first set of parameter values that define a response to a volume change request;
- after a given elapsed time after the start of playback, establishing a second volume control state characterized by a second set of parameter values, wherein the second set of parameter values define a different response to a volume change request than the response defined by the first set of parameter values;
- in response to a volume change request, changing the volume in accordance with the current volume control state.

30. The computer-readable medium of claim 29 wherein:
- the given elapsed time comprises a plurality of subintervals;
- the first volume control state comprises a plurality of sub-states, at least some of which differ from one another, depending on which of the plurality of subintervals the volume change request falls into; and
- the first set of parameter values comprises a plurality of subsets of parameter values.

31. The computer-readable medium of claim 29 wherein the method further comprises establishing an intermediate volume control state between the times of establishing the first and second volume control states, wherein the intermediate volume control state is characterized by an intermediate set of parameter values that define a response that is different from the responses of the first and second volume control states.

* * * * *